United States Patent
Pham et al.

(10) Patent No.: US 6,969,654 B1
(45) Date of Patent: Nov. 29, 2005

(54) FLASH NVROM DEVICES WITH UV CHARGE IMMUNITY

(75) Inventors: Tuan Duc Pham, San Jose, CA (US); Mark T. Ramsbey, Sunnyvale, CA (US); Jeffrey A. Shields, Sunnyvale, CA (US); Angela T. Hui, Fremont, CA (US); Dawn Hopper, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 189 days.

(21) Appl. No.: 09/727,714

(22) Filed: Nov. 28, 2000

Related U.S. Application Data

(60) Provisional application No. 60/212,618, filed on Jun. 19, 2000.

(51) Int. Cl.[7] .............................................. H01L 21/336
(52) U.S. Cl. ...................................................... 438/261
(58) Field of Search ................................ 438/257–267, 438/142, 197, 275, FOR 202, FOR 203; 257/314–320, 257/E29.306, E29.308, E29.309, E27.103, 257/213, 288, 681, E21.68, E21.681, E21.688; 365/185.33; 711/103

(56) References Cited

U.S. PATENT DOCUMENTS

| | | | | |
|---|---|---|---|---|
| 4,847,667 A | * | 7/1989 | Mori | 365/185.32 |
| 4,943,836 A | * | 7/1990 | Mori | 257/323 |
| 5,068,697 A | * | 11/1991 | Noda et al. | 257/315 |
| 5,729,035 A | * | 3/1998 | Anma | 451/1 |
| 5,861,347 A | * | 1/1999 | Maiti et al. | 148/DIG. 117 |
| 5,879,993 A | * | 3/1999 | Chien et al. | 438/266 |
| 5,998,301 A | | 12/1999 | Pham et al. | |
| 6,037,547 A | | 3/2000 | Blish, II | |
| 6,333,223 B1 | * | 12/2001 | Moriwaki et al. | 438/241 |
| 6,350,651 B1 | * | 2/2002 | Wada et al. | 438/257 |
| 6,486,506 B1 | * | 11/2002 | Park et al. | 257/314 |

* cited by examiner

*Primary Examiner*—Brook Kebede
(74) *Attorney, Agent, or Firm*—Farjami & Farjami LLP

(57) ABSTRACT

A method of preventing UV charging of flash NVROM cells during fabrication and a device thereby formed. During device fabrication, a UV blocking layer is deposited over the floating gates. The UV blocking layer substantially blocks UV from entering the gate regions so as to prevent electron mobility sufficient to render the cells unprogrammable or unerasable. The reduced electron migration during processing of the NVROM leads to increased yield and reliability of the devices.

5 Claims, 2 Drawing Sheets

FLASH NVROM DEVICES WITH UV CHARGE IMMUNITY

CROSS-REFERENCE TO RELATED APPLICATION(S)

This application claims priority from U.S. Provisional Application Ser. No. 60/212,618 filed Jun. 19, 2000.

FIELD OF THE INVENTION

This invention pertains generally to read-only memory (ROM) devices and fabrication techniques, and more particularly to preventing electrons in the floating gate of a flash non-volatile read only memory (NVROM) device from being affected by ultraviolet light (UV) exposure during fabrication.

BACKGROUND OF THE INVENTION

In recent years, the use of solid-state memory devices as a form of data storage media in computer and other electronic equipment has become widespread. For example, programmable ROMs (PROMs), which are non-volatile, are often used for storing data or programs which do not change frequently and which must survive when power is removed from the memory.

All PROM's can be programmed at least once. However, there are also types of PROMs that can be erased. For example, flash non-volatile read only memory (NVROM) devices, such as electrically erasable PROMs (EEPROMs) or the like, are widely used to provide high density non-volatile memory that is capable of in-system reprogrammability.

In the case of a conventional EEPROM, which is a polysilicon floating gate flash device, a "0" state is defined by the voltage on the floating gate being above a $V_t(0)$ level while a "1" state is defined by the voltage on the gate being below a $V_t(1)$ level. In other words, a "0" state occurs when the floating gate is charged with electrons to a voltage above a threshold level. The cell is erased to the "1" state by applying a voltage of opposite polarity to erase the negative charge. It will be appreciated, therefore, that sufficient electron mobility within a cell can cause the cell to transition to $V_t(1)$, thereby resulting in a loss of the "0" state. However, because electrons migrate so slowly over time, state changes due to electron migration are generally not a problem. Therefore, once each cell has been programmed to a "0" state by creating a negative charge on the cell, it will generally remain in the "0" state until the cell is intentionally erased to the "1" state by erasing the charge on the cell.

On the other hand, exposure of the gate region of the cell to ultraviolet light will vastly accelerate movement of electrons in the gate region and can cause a state transition. This can be a particular problem during device fabrication, since the gates are often exposed to UV light during deposition, etching, and other steps in the normal fabrication process. Exposure to UV light during fabrication can cause such high electron mobility that it renders the cell unprogrammable or unerasable. Sensitivity to UV during processing is further exacerbated due to the fact that the reduced operating voltages of newer devices have brought $V_t(0)$ closer to $V_t(1)$.

Therefore, a need exists for a method of reducing in-line UV charging during processing of flash NVROM devices to enhance the yield and reliability of these devices. The present invention satisfies those needs, as well as others, and overcomes the deficiencies found in previously developed solutions.

BRIEF SUMMARY OF THE INVENTION

The present invention generally comprises an NVROM device and its method of fabrication, wherein the UV charge is stored in a nitride layer, and wherein a UV blocking layer overlays the nitride layer. More particularly, the UV blocking layer overlays the control gates which in turn overlay the nitride layer. The UV blocking layer can be inserted in the process flow at different stages of fabrication. The UV blocking layer is preferably formed from a high UV absorption material, such as silicon oxynitride (SiON) or silicon nitride (SiN or $Si_3N_4$), a pure stoichiometric material being preferred. In a flash NVROM according to the present invention, exposure of a cell to UV light will not cause the electrons to migrate to a programmed state. Instead, exposure to UV light causes more electrons to collect in the nitride layer, potentially raising the threshold of the cell so high that it cannot be electrically erased. The UV blocking layer prevents UV light from reaching the nitride layer and increasing the charge in the layer.

Advantages of the present invention include improving yields for flash NVROM memory devices, improving reliability of programmed NVROM devices, and improving memory retention in the cells of flash NVROM devices. Further advantages of the present invention will be explicated in the following portions of the specification, wherein the detailed description is for the purpose of fully disclosing preferred embodiments of the invention without thereon placing limitations.

BRIEF DESCRIPTION OF THE DRAWING

For a fuller understanding of the present invention, reference is made to the accompanying Drawing. Reference numbers refer to the same or equivalent parts of the present invention throughout the several figures of the Drawing.

DETAILED DESCRIPTION OF THE INVENTION

Referring more specifically to the drawings, for illustrative purposes, the present invention is embodied in the apparatus therein generally shown and the fabrication method described in connection therewith. The apparatus may also vary as to both configuration and to details. The method may also vary as to the specific steps and sequence without departing from the basic concepts as herein disclosed.

Figure 1:
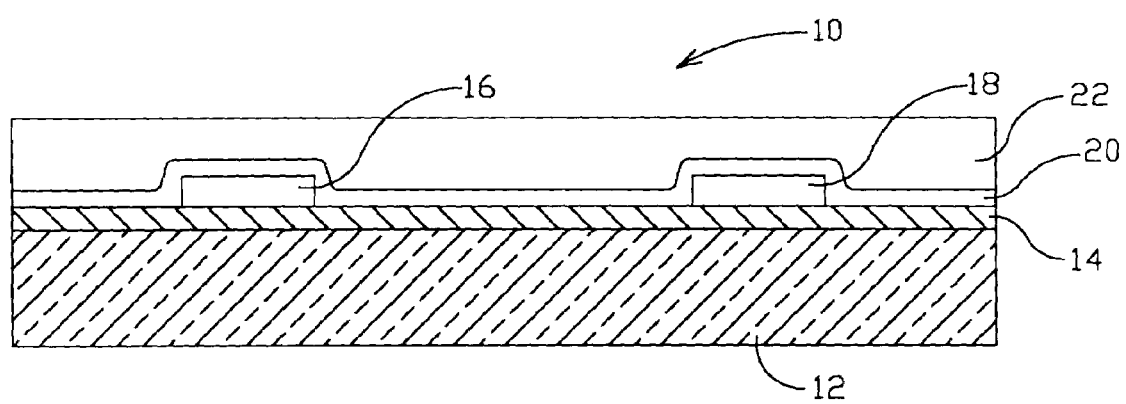
FIG. 1 is a schematic cross-sectional view of a typical flash NVROM device, in accordance with the prior art.
Figure 2:
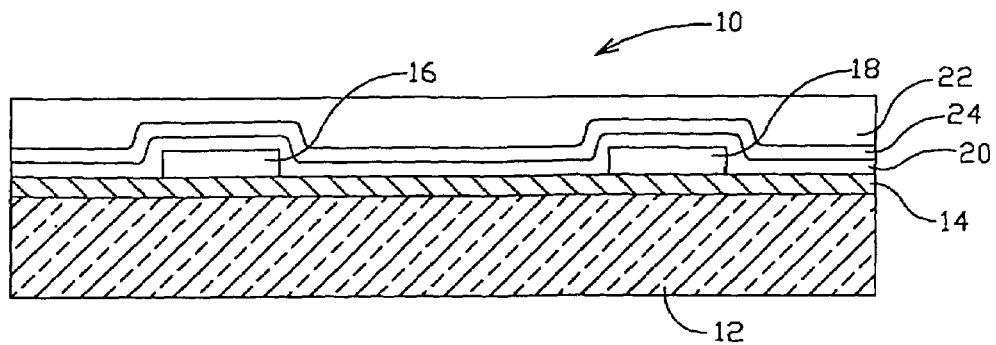
FIG. 2 is a schematic cross-sectional view of a first embodiment of a flash NVROM device, according to the present invention based on the device shown in FIG. 1.

Referring first to FIG. 1, an example of a conventional two cell NVROM device 10 is shown in accordance with the prior art. In the example shown, the device comprises a substrate layer 12, a floating gate comprising an oxide-nitride-oxide (ONO) dielectric layer 14 overlying the substrate layer, a pair of control gates 16 and 18 overlying the ONO layer, a high temperature oxide (HTO) layer 20 overlying and surrounding control gates 16 and 18, and a borophosphosilicate glass (BPSG) interlayer dielectric (ILD) layer 22 overlaying the HTO layer. In such a device, the nitride layer is particularly susceptible to electron migration resulting from exposure to UV.

Referring now to FIG. 2 through FIG. 5, in accordance with the present invention, ONO layer 14 is overlaid with a UV blocking layer 24 which preferably comprises a material with high UV absorption, such as SiON, SiN, or $Si_3N_4$. While the thickness of the UV blocking layer 24 can vary, the preferred thickness ranges from approximately one hundred to approximately two thousand Angstroms.

Figure 3:
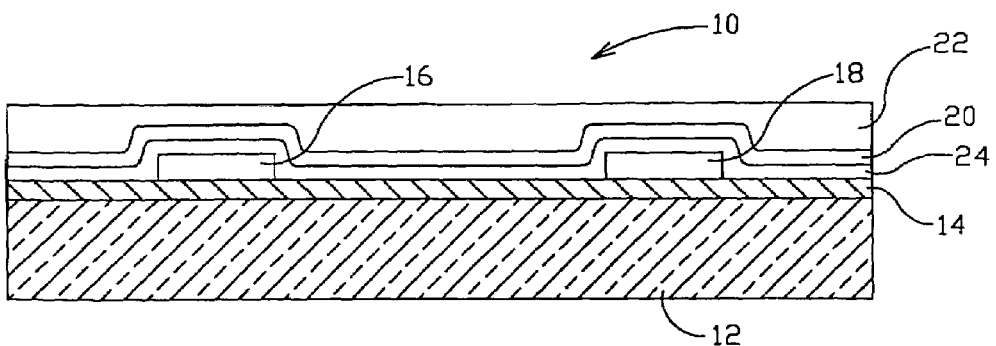
FIG. 3 is a second embodiment of a flash NVROM device, according to the present invention.
Figure 4:
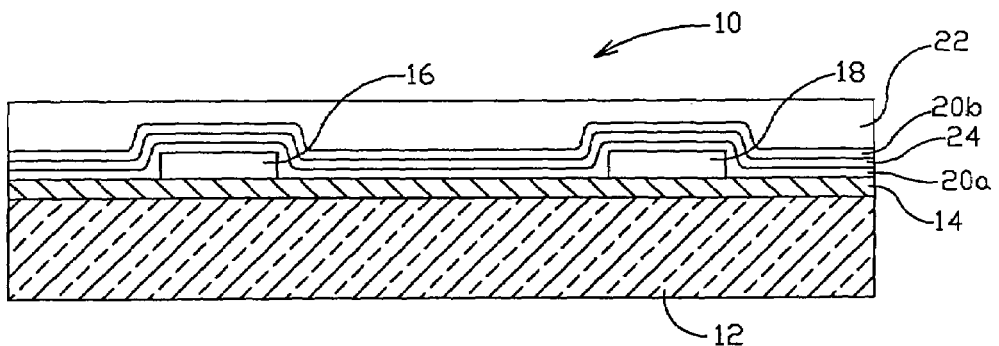
FIG. 4 is a third embodiment of a flash NVROM device, according to the present invention.
Figure 5:
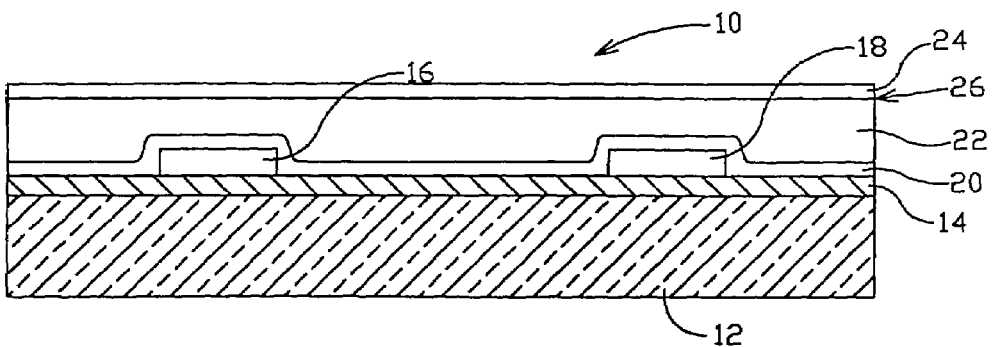
FIG. 5 is a fourth embodiment of a flash NVROM device, according to the present invention.

ONO layer 14 can be overlaid by UV blocking layer 24 at various stages of device fabrication. For example, in FIG. 2, control gates 16, 18 have been deposited over ONO layer 14, an HTO layer 20 has been deposited over control gates 16, 18, and UV blocking layer 24 has been deposited over HTO layer 20. In FIG. 3, UV blocking layer 24 has been deposited over control gates 16, 18 before HTO layer 20 has been deposited. In FIG. 4, UV blocking layer 24 is shown as having been deposited midway through HTO deposition, such as after a one-half thick layer 20a of HTO has been deposited. The remaining one-half thick layer 20b of HTO is shown deposited over UV blocking layer 24. In FIG. 5, UV blocking layer 24 is shown deposited on top of BPSG 22 after polishing at the ILD interface 26. Deposition of UV blocking layer 24 could also take place after pre-source/drain (pre-S/D) implant oxidation.

As can be seen, therefore, the UV blocking layer prevents migration of electrons to or from the ONO layer during NVROM device processing that would otherwise occur due to UV exposure. It will be appreciated that the invention is not limited to any particular sequence of UV blocking layer deposition. The UV blocking layer can be inserted at any convenient point in device processing after the ONO layer is formed, such as after formation of the control gates. Preferably, however, the UV blocking layer is deposited after planarization of the BPSG layer and then etched to provide for metallization of contacts to the control gates.

While the invention has been described in the context of particular device configurations and fabrication steps, it will also be appreciated that the invention can be employed within a variety of NVROM topologies and circuit material technologies. Furthermore, the invention may be applied to any structure of NVROM device that is susceptible to UV charging during processing.

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for."

What is claimed:

1. A method of fabricating a flash nonvolatile read-only memory (NVROM) semiconductor device having ultraviolet (UV) charge immunity, the method comprising:
   providing a semiconductor substrate:
   forming an oxide-nitride-oxide (ONO) layer on the semiconductor substrate;
   forming at least one control gate on the ONO layer;
   forming a first high temperature oxide (HTO) layer over the at least one control gate and the ONO layer;
   forming a UV blocking layer over the first HTO layer;
   forming a second HTO layer over the UV blocking layer; and
   forming a borophosphosilicate (BPSG) interlayer dielectric (ILD) layer over the second HTO layer;
   wherein the UV blocking layer substantially prevents UV light from reaching a nitride layer of the ONO layer.

2. The method, as recited in claim 1, wherein the UV blocking layer is formed from a material selected from a group consisting essentially of stoichiometric silicon nitride ($Si_3N_4$) and stoichiometric silicon oxynitride (SiON).

3. The method, as recited in claim 1, further comprising polishing the BPSG ILD.

4. The method, as recited in claim 1, wherein forming the UV blocking layer comprises forming the UV blocking layer with a thickness in the range of approximately 100 Å up to approximately 2000 Å.

5. The method, as recited in claim 1, further comprising etching the UV blocking layer for facilitating metallization of at least one contact to the at least one control gate.

* * * * *